US008298434B2

(12) United States Patent
Wei et al.

(10) Patent No.: US 8,298,434 B2
(45) Date of Patent: Oct. 30, 2012

(54) METHOD OF FORMING AN ELECTRODE INCLUDING AN ELECTROCHEMICAL CATALYST LAYER

(75) Inventors: Tzu-Chien Wei, Hsinchu (TW);
Hai-Peng Cheng, Taipei County (TW);
Shien-Ping Feng, Hsinchu County (TW); Jo-Lin Lan, Kaohsiung (TW);
Chao Peng, Taipei County (TW);
Wen-Chi Hsu, Tainan County (TW);
Ya-Huei Chang, Taoyuan County (TW);
Wen-Hsiang Chen, Hsinchu City (TW)

(73) Assignee: Tripod Technology Corporation, TaoYuan County (TW)

( * ) Notice: Subject to any disclaimer, the term of this patent is extended or adjusted under 35 U.S.C. 154(b) by 382 days.

(21) Appl. No.: 12/609,010

(22) Filed: Oct. 29, 2009

(65) Prior Publication Data

US 2010/0108240 A1 May 6, 2010

(30) Foreign Application Priority Data

Oct. 31, 2008 (TW) ................ 97142076 A

(51) Int. Cl.
*C03C 15/00* (2006.01)
(52) U.S. Cl. ........... 216/83; 216/57; 216/95; 216/97; 427/58; 427/74; 427/304; 427/372.2
(58) Field of Classification Search .............. None
See application file for complete search history.

(56) References Cited

U.S. PATENT DOCUMENTS 6,071,570 A * 6/2000 Hardee et al. .......... 205/67
2008/0063788 A1* 3/2008 Wei et al. ............... 427/77

FOREIGN PATENT DOCUMENTS

JP 2006-073487 3/2006

OTHER PUBLICATIONS

Method of Forming an Electrode Including an Electrochemical Catalyst Layer (U.S. Appl. No. 12/213,307, filed Jun. 18, 2008).
Pol (N-vinyl-2-pyrrolidone)-Capped Platinum Nanoclusters on Indium-Tin Oxide Glass as Counterelectrode for Dye-Sensitized Solar Cells (Applied Physics Letters 88, 103122 , 2006).
Immobilization of Poly (N-vinyl-2-pyrrolidone)—Capped Platinum Nanoclusters on Indium-Tin Oxide Glass and Its Application in Dye-Sensitized Solar Cells (J. Phys. Chem. C, 2007, 111 (12), 4847-4853).
Counter-electrode Function in Nanocrystalline Photoelectrochemical Cell Configurations (Coord. Chem. Rev., 248 (2004), 1421-1445).
X-ray Photoelectron Spectroscopy Analysis of the Stability of Platinized Catalytic Electrodes in Dye-Sensitized Solar Cells (Surf. Interface Anal., 2004; 36: 1437-1440).
Protecting Polymers in Suspension of Metal Nanoparticles ( Polymers for Advanced Technologies 12, 724~733, 2001 ).

* cited by examiner

*Primary Examiner* — Lan Vinh
*Assistant Examiner* — Jiong-Ping Lu
(74) *Attorney, Agent, or Firm* — CKC & Partners Co., Ltd.

(57) ABSTRACT

A method of forming an electrode having an electrochemical catalyst layer is disclosed. The method includes etching a surface of a substrate, followed by immersing the substrate in a solution containing surfactants to form a conditioner layer on the surface of the substrate, and immersing the substrate in a solution containing polymer-capped noble metal nanoclusters dispersed therein to form a polymer-protected electrochemical catalyst layer on the conditioner layer.

14 Claims, 3 Drawing Sheets

METHOD OF FORMING AN ELECTRODE INCLUDING AN ELECTROCHEMICAL CATALYST LAYER

RELATED APPLICATIONS

This application claims priority to Taiwan Application Serial Number 97142076, filed Oct. 31, 2008, which is herein incorporated by reference.

BACKGROUND

1. Field of Invention

The present invention relates to a method of forming an electrode with an electrochemical catalyst layer. More particularly, the present invention relates to a method for forming an electrode including an electrochemical catalyst layer comprised of polymer-capped nanoclusters.

2. Description of Related Art

Recently, dye-sensitized solar cells (DSSC) have attracted attention as a potentially low-cost energy device. Typically, a DSSC consists of a dye-sensitized nanocrystalline semiconductor film on an Indium-tin oxide (ITO) or fluorine-doped tin oxide (FTO) glass as the photo-anode, a platinized counter electrode acting as the cathode, and iodide/tri-iodide redox couples in a proper mediator as the electrolyte. The working principle of a DSSC is summarized in the five steps below, as shown in FIG. 1. (1) Photo-excitation on dye molecules 110 induces charge separation (see arrow 1). (2) Charge (electron) is injected into the conduction band of mesoporous titanium dioxide (TiO$_2$) 160. (3) Charge passes through the outer circuit via the electronic load 130 (see arrow 2). (4) Dye reduces to ground state by redox couples 140 in the electrolyte (see arrow 3). (5) Redox couples 140 reduce on counter electrode 150 by the charge coming from the outer circuit (see arrow 4).

In a DSSC, the counter electrode functions as a reduction reaction site expressed as the following:

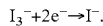

$$I_3^- + 2e^- \rightarrow I^-.$$

This reduction reaction is vital since iodide ions are responsible for the regeneration of oxidized dye molecules. Once the dye regeneration can not o catch up the dye oxidation (i.e. electron injection from dye molecules to the conduction band of TiO$_2$), the conversion efficiency is reduced and the DSSC deteriorates because iodine crystals may be deposited on the surface of the counter electrode.

In the prior arts, the naked ITO or FTO glass shows extremely slow kinetics of tri-iodide reduction in organic solvents. In order to minimize the over-potential, catalyst material is applied to the ITO or FTO glass to speed up the reaction.

So far, platinum (Pt) has been used almost exclusively as the catalyst material. Depending on the cost and efficiency, there are many methods to form a thin layer of Pt. Sputtering is a common method. This platinized electrode exhibits fair performance. However, sputtering requires an ultra-high vacuum environment and is not suitable for mass production.

Papageorgiou et al. have developed a method called "thermal cluster platinum catalyst" (*Coord. Chem. Rev.*, 2004, 248, pp 1421). This method provides low Pt loading (about 2~10 µg/cm$^2$), superior kinetic performance (charge-transfer resistance, $R_{CT}$<0.1 Ωcm$^2$) and mechanical stability with respect to conventional platinum deposition methods like sputtering or electrochemical deposition. Wang et al. (*Surf. Interface Anal.*, 2004, 36, pp 1437) have studied the stability of thermal cluster Pt (TCP) electrode with X-ray photoelectron spectroscopy and found that the electrochemical catalytic performance of TCP may be reduced slightly due to adsorbed iodide on TCP's surface.

Other materials such as carbon and conducting polymers are also proposed to be the catalyst for tri-iodide reaction in DSSC. These new materials usually need being deposited as thicker films on the substrate to obtain acceptable catalytic effect, and are still being developed.

Hence, lots of research on DSSC and technologies relative to DSSC address lower costs and higher performance.

SUMMARY

It is therefore an objective of the invention to provide a method of forming an electrode with an electrochemical catalyst layer comprised of polymer-capped nanoclusters. Using this method, the adhesion between the electrochemical catalyst layer and the electrode is improved, and thus the catalytic effect is enhanced.

It is another objective of the invention to provide a method of manufacturing an electrochemical device including an electrode made by the aforementioned method. The performance of the electrochemical device is better because the electrode thereof has greater catalytic effect.

In accordance with one aspect of the invention, a method of forming an electrode with an electrochemical catalyst layer is provided. The method includes etching a surface of a substrate, followed by immersing the substrate in a first solution containing a surfactant to form a conditioner layer on the surface of the substrate, and immersing the substrate in a second solution to form a polymer-protected electrochemical catalyst layer on the conditioned layer, wherein the second solution contains polymer-capped noble metal nanoclusters dispersed therein.

In accordance with another aspect of the invention, a method of manufacturing an electrochemical device is provided. The method includes assembling two electrodes with a sealing layer, and injecting an electrolyte into a space between the electrodes. Either one or both of the electrodes are formed by etching and conditioning a surface of a substrate sequentially, and immersing the substrate in a second solution containing polymer-capped noble metal nanoclusters to form a polymer-protected electrochemical catalyst layer on the surface of the substrate.

As embodied and broadly described herein, the invention provides a method to improve the adhesion between the substrate and the electrochemical catalyst layer, and thus the catalytic effect and the performance of the resultant electrochemical device.

It is to be understood that both the foregoing general description and the following detailed description are by examples, and are intended to provide further explanation of the invention as claimed.

BRIEF DESCRIPTION OF THE DRAWINGS

The foregoing and other objects, features and advantages of the present invention will become more apparent from the following detailed description when taken in conjunction with the accompanying drawings, in which.

DESCRIPTION OF THE PREFERRED EMBODIMENTS

Figure 1:
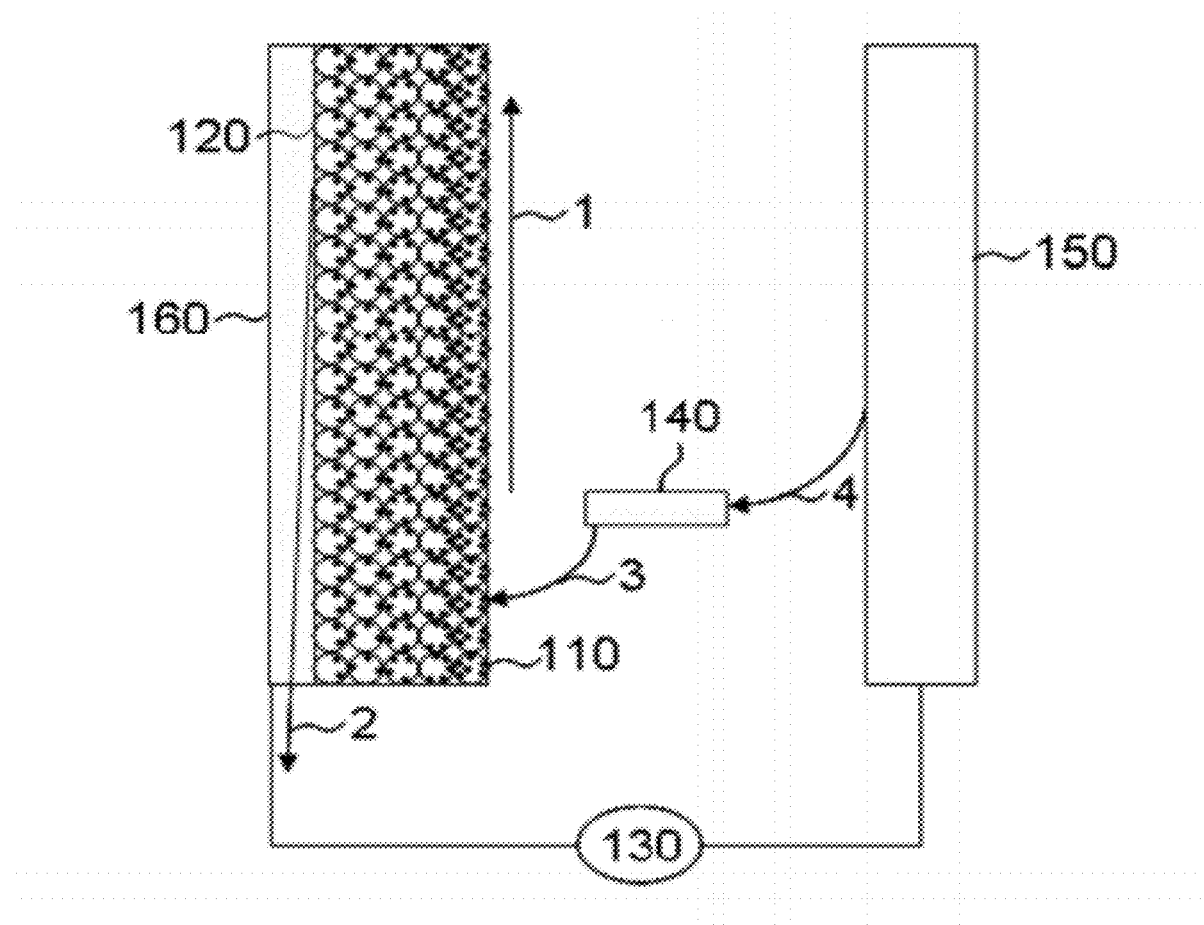
FIG. 1 is a schematic view showing the working principle of a conventional DSSC.

Reference will now be made in detail to the embodiments of the invention, examples of which are illustrated in the accompanying drawings. Wherever possible, the same reference numbers are used in the drawings and the description to refer to the same or like parts.

Figure 2A:
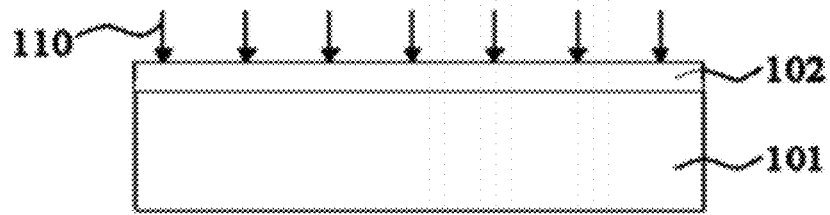
FIG. 2A through FIG. 2D are cross-sectional views illustrating a method of forming an electrode having an electrochemical catalyst layer according to a preferred embodiment of the invention.

The method of forming an electrode having an electrochemical catalyst layer according to one embodiment of the invention is shown in FIG. 2A to FIG. 2D. Referring to FIG. 2A, a substrate 101 is provided. The material of the substrate 101 is not limited, but is preferably glass or plastic as applied to the electrode of a solar cell. A conductive layer 102 for transferring charges is formed on the surface of the substrate 101. Non-limiting examples of the conductive layer 102 include ITO glass, graphite, and metal like nickel and stainless steel. Although there is no particular limitation in the methods for forming the conductive layer, conventional methods known to those skilled in the art, including sputtering, evaporation and coating, may be used.

The surface of the substrate 101 is etched as indicated by the arrows 110. The etched surface becomes rough, which benefits the adsorption of a succeeding film. The etching step may be a dry-etch process or a wet-etch process. In one embodiment, the surface of the substrate is processed by wet to etching. For example, the substrate is treated with a mixture of iron chloride and hydrochloride ($FeCl_3$: HCl=27.5%10.3%) at 40° C. for 240 seconds. The etching conditions such as the used etchants, concentration, temperature, processing time may vary dependent on the types of substrates or the desired applications, and the present invention is not limited thereto. In another embodiment, the substrate 101 is rinsed with de-ionized water prior to performing the next step.

Figure 2B:
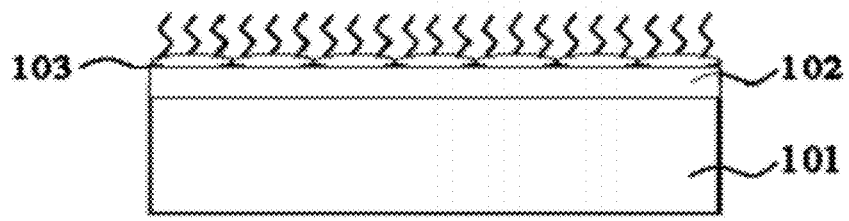

Referring to FIG. 2B, the surface of the conductive layer 102 is conditioned by, for example, immersing or dipping the substrate 101 in a solution containing surfactants to form a conditioner layer 103 on the surface of the conductive layer 102. Preferably, a cationic surfactant is utilized, and quaternary ammonium salt is the common one. The conditioner layer is adapted to change the surface charge state, so as to improve the adhesion between the conductive layer 102 and a succeeding film (e.g. a noble metal catalyst layer).

Figure 2C:
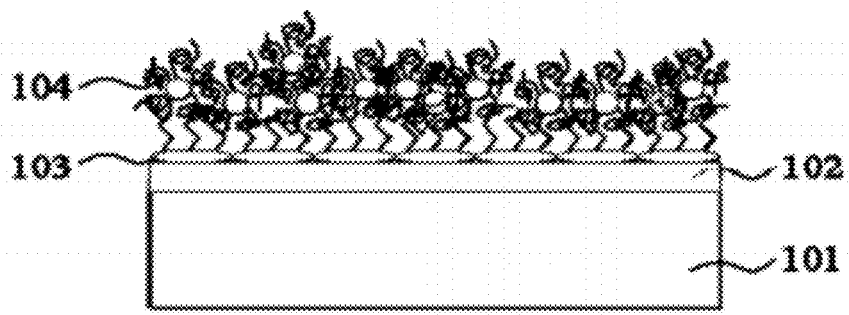

The substrate 101 is then immersed in a second solution as shown in FIG. 2C. Such kinds of solutions contain polymer-capped noble metal nanoclusters dispersed therein. These polymer-capped noble metal nanoclusters are attached to the conditioner layer 103 over the substrate 101 so that a noble metal catalyst layer 104 is formed on the surface of the conditioner layer 103. In one embodiment, a cationic surfactant is used to condition the substrate, resulting in the polymer-capped noble metal with negative charges being adsorbed on the substrate. Since the surface of the substrate 101 has been roughened, the noble metal catalyst layer 104 is effectively attached to the substrate 101 (or the conductive layer 102).

The second solution may be initially prepared by providing a polymer solution capable of capping a noble metal, followed by adding the precursor of the noble metal salt into the polymer solution. Preferably, the polymer solution is composed of poly(N-vinyl-2-pyrrolidone) (PVP), poly(acrylamide) (PAM), poly(vinyl alcohol) (PVAL), poly(acrylic acid) (PRA), poly(ethyleneimine) (PEI) or the like. Preferably, the noble metal from precursors is palladium (Pd), platinum (Pt), ruthenium (Ru), silver (Ag), gold (Au), or any other noble metal which can serve as a catalyst in a reduction reaction. Finally, the reductant for precursors is introduced into the polymer solution containing noble metal salt, and thus the noble metal salt is reduced to noble metal nanoclusters dispersed uniformly in the solution since polymers cap the noble metal. As such, when the substrate 101 is dipped into the second solution, an electrochemical catalyst layer formed from polymer-capped nanoclusters of the noble metal is uniformly distributed over the substrate 101. The method for preparing a solution comprising polymer-capped metal is described in detail by Hidefumi Hirai et al. in *Polymers for Advanced Technologies* (12, pp 724~733), published in 2001, entitled "Protecting polymers in suspension of metal nanoparticles", which is hereby incorporated by reference in its entirety.

The solvent for the second solution may be used with no particular limitation. Preferably, the solvent has solubility with polymer and a low boiling point.

It is to be noted that the mixing ratio in the second solution on the weight basis, i.e. ratio of the weight of the polymer (PW) to the weight of the noble metal (MW) is about 0.5~6. If the amount of polymer in the second solution is not enough, stable suspension cannot be achieved and a precipitating phenomenon may occur. On the other hand, if the amount of polymer in the second solution is excessive, the noble metal cannot work well and then the efficiency of the catalyst decreases.

Generally, the size of noble metal nanoclusters ranges between about 10 nanometers (nm) and about 50 nm. A relatively thin electrochemical catalyst layer is formed using well-dispersed noble metal nanoclusters. In other words, an acceptable catalytic effect may be induced with less amount of noble metal.

It is preferable that the immersion temperature for the substrate 101 in the second solution is lower than 50° C., and more preferably is at room temperature. According to a preferred embodiment of the invention, it is not necessary for the electrode with an electrochemical catalyst layer to be subjected to high temperature processing. Therefore, there is less impact on the sheet resistance of the conductive layer 102 of the substrate 101, and the resultant cell performance is controlled well. Compared with conventional deposition methods like sputtering, the operations and equipment provided herein is simplified, and the manufacturing cost is reduced.

Figure 2D:
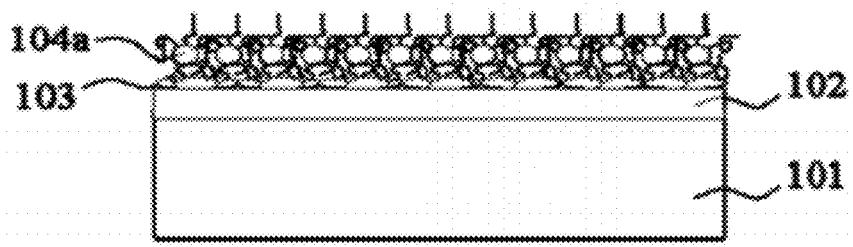

Next, referring to FIG. 2D, the structure in FIG. 2C is thermally treated such that the surfactants and polymers over the substrate 101 are degraded partially or completely to expose noble metal nanoclusters 104a. In one embodiment, the structure is thermally treated at a temperature about 270° C. for 10 minutes for an ITO glass substrate. In one embodiment, the electrode with the noble metal catalyst layer 104 is heated at a temperature in the range of about 350° C. to 425°

C. for 15 minutes for an FTO glass substrate. The thermal-treating temperature and duration may vary depending on the types of surfactants, polymers, noble metals, and substrates, the structure of electrodes, the amount of polymers, as well as the configuration of cells.

The examples of the noble metal catalyst layer are further described in U.S. patent application Ser. No. 11/715,426, filed on Mar. 8, 2007, entitled "Method for preparing an electrode comprising an electrochemical catalyst layer thereon", and U.S. patent application Ser. No. 12/213,307, filed on Jun. 18, 2008, entitled "Method of forming an electrode including an electrochemical catalyst layer", both of which are hereby incorporated by reference in their entirety to the extent not inconsistent with the claimed invention.

Figure 3:
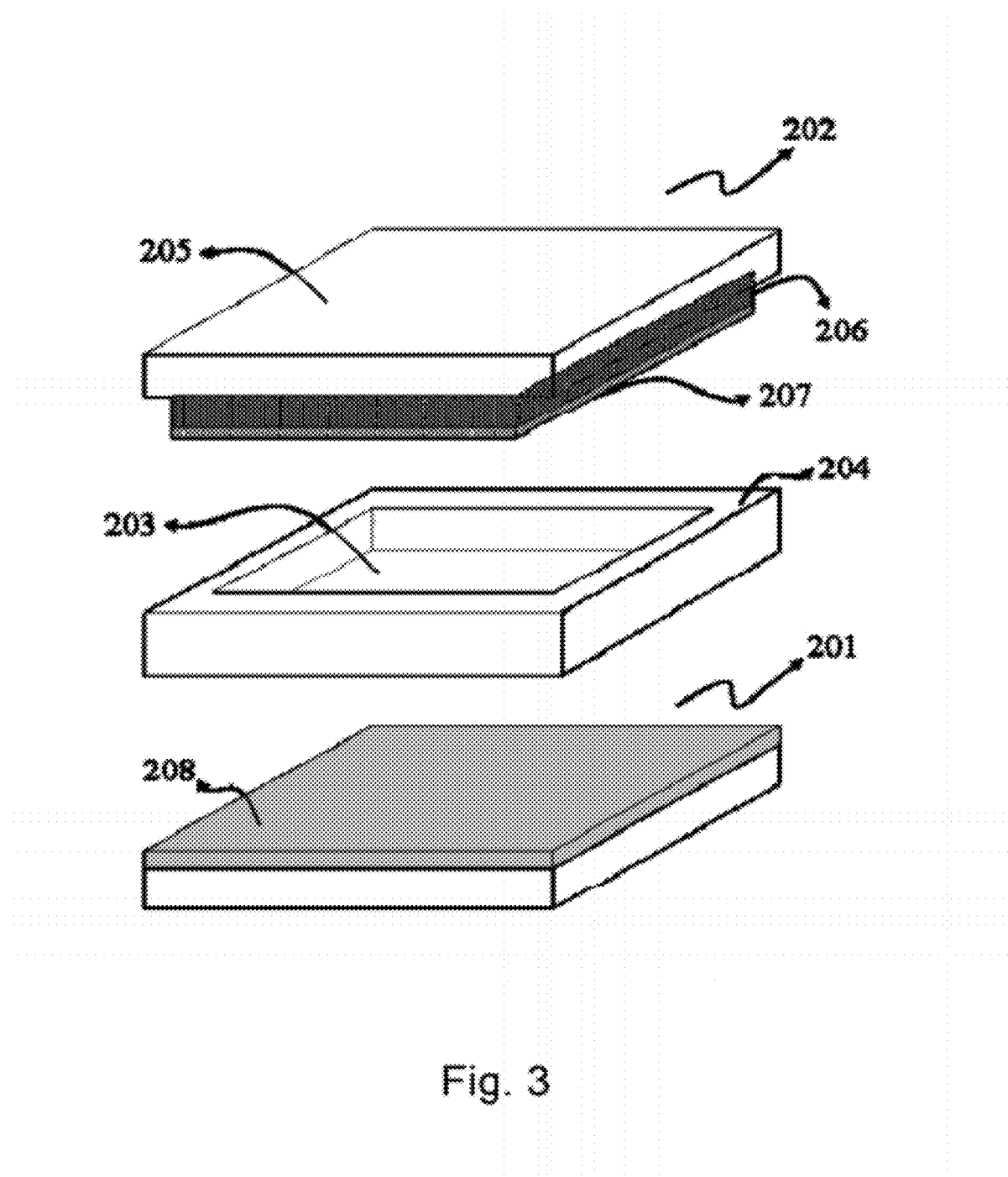
FIG. 3 is a three-dimensional exploded view showing an electrochemical device manufactured by the method according to one embodiment of the invention.

FIG. 3 is a perspective exploded view of an electrochemical device with an electrode made in accordance with one embodiment of the invention. As illustrated in FIG. 3, the electrochemical device includes a cathode 201, an anode 202, a sealing layer 204 sandwiched between the cathode 201 and the anode 202, and an electrolyte (filling in a hollow 203 of the sealing layer 204). The electrochemical device encompasses all types of devices to perform electrochemical reactions. Particular examples of the electrochemical device are fuel cells or solar cells.

Provided that the electrochemical device in one embodiment is a dye-sensitized solar cell (DSSC), one or both of the electrodes (i.e. the cathode 201 and/or the anode 202) are formed by the aforementioned method in FIG. 2A to FIG. 2D. Preferably, the cathode 201 has the electrochemical catalyst layer 208. In other words, the electrode comprises a conductive layer formed on a surface of a substrate, a conditioner layer formed on a surface of the conductive layer, and a plurality of polymer-capped noble metal nanoclusters grabbed by the conditioner layer as an electrochemical catalyst layer of the electrode. Preferably, the conductive layer is ITO glass, graphite or metal, such as nickel and stainless steel. Preferably, the polymer contained in the electrochemical catalyst layer of the electrode is poly(N-vinyl-2-pyrrolidone) (PVP), poly(acrylamide) (PAM), poly(vinyl alcohol) (PVAL), poly(acrylic acid) (PAA), poly(ethyleneimine) (PEI) or the like, and the noble metal capped by polymers is selected from the group consisting of palladium, platinum, ruthenium, silver, and gold.

The anode of a DSSC (i.e. the electrode without the electrochemical catalyst layer) preferably includes a transparent conductive glass 205 on a substrate. Non-limiting examples of the transparent conductive glass 205 include indium tin oxide (ITO), fluorine-doped tin oxide (FTO), antimony-doped tin oxide (ATO), aluminum-doped zinc oxide (AZO), gallium-doped zinc oxide (GZO), or indium zinc oxide (IZO). Generally, the anode also includes a $TiO_2$ layer 206 formed on the surface of the transparent conductive glass 205; wherein the $TiO_2$ layer 206 has dyes 207 near the surface thereof. The anode of a DSSC may be manufactured by a conventional method known to those skilled in the art.

The dye commonly used in a DSSC may be represented by Formula 1, Formula 2, Formula 3, or Formula 4 below, but is not limited thereto. Also, Nazeeruddin et al. have studied the property and structure of dyes, published in the *Journal of Physical Chemistry* (107, pp 8981) in 2003, entitled "Investigation of sensitizer adsorption and the influence of protons on current and voltage of a dye-sensitized nanocrystalline $TiO_2$ solar cell", which is hereby incorporated by reference in its entirety.

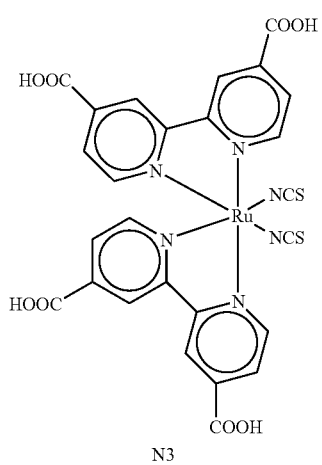

[Formula 1]

N3

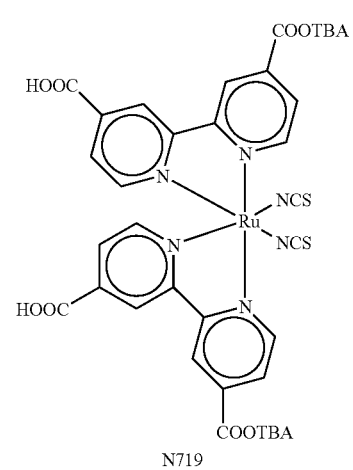

[Formula 2]

N719

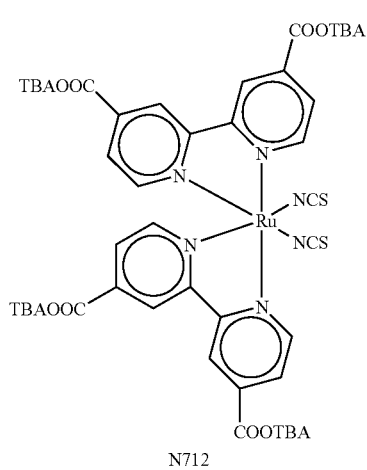

[Formula 3]

N712

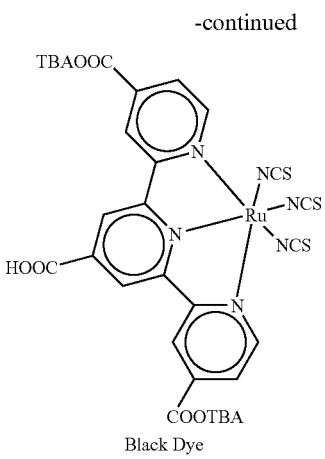

Black Dye [Formula 4]

After forming the cathode 201 and the anode 202, the electrodes are assembled by, for example, a conventional method known to those skilled in the art to construct an electrochemical device. In one embodiment, the cathode 201 and the anode 202 are laminated by means of an adhesive (e.g. a sealing layer 204), and an electrolyte is injected into the space between the electrodes through an inlet. More particularly, the timing for injecting the electrolyte into the electrochemical device depends on the desired quality of the electrochemical device and the manufacturing process for the final product. So the electrolyte may be injected into the electrochemical device during the assembly of the electrochemical device or at the final step of the assembly. Although there is no particular limitation in material for the sealing layer, it is preferable the sealing layer is a polymer film capable of thermal condensation at a low temperature.

As can be seen from the foregoing, an electrochemical catalyst layer for an electrode is formed from polymer-capped noble metal nanoclusters via immersing or dipping, by which the amount of noble metal used is reduced according to the invention. The surface of the substrate is roughened by etching, for example, before the electrochemical catalyst layer is formed, so that the adhesion between the electrochemical catalyst layer and the substrate is improved, and the catalytic effect is enhanced. Moreover, the overall procedure is not operated at a substantially high temperature; for instance, the immersion step is performed below about 50° C. Therefore, the inventive method has lower cost of materials and equipment and competent performance with conventional methods. It is suitable for mass production as well.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming an electrode including an electrochemical catalyst layer, the method comprising:
    providing a substrate with a conductive layer formed on a surface of the substrate;
    etching the surface of the substrate;
    immersing the substrate in a first solution containing a surfactant to form a conditioner layer on the conductive layer after etching the surface of the substrate;
    immersing the substrate in a second solution to form a polymer-protected electrochemical catalyst layer on the conditioned layer, wherein the second solution contains polymer-capped noble metal nanoclusters dispersed in the second solution; and
    thermally treating the polymer-protected electrochemical catalyst layer at a temperature in the range of 350° C. to 425° C. to degrade the surfactant and the polymer of the polymer-capped noble metal nanoclusters.

2. The method of claim 1, further comprising rinsing the substrate before immersing the substrate in the first solution.

3. The method of claim 1, wherein immersing the substrate in the second solution comprises dipping the substrate into the second solution at a temperature below 50° C.

4. The method of claim 1, wherein the polymer-protected electrochemical catalyst layer comprises a noble metal selected from the group consisting of palladium, platinum, ruthenium, silver, and gold.

5. The method of claim 1, wherein the polymer-protected electrochemical catalyst layer comprises a polymer selected from the group consisting of poly(N-vinyl-2-pyrrolidone) (PVP), poly(acrylamide) (PAM), poly(vinyl alcohol) (PVAL), poly(acrylic acid) (PAA), and poly(ethyleneimine) (PEI).

6. The method of claim 1, wherein etching the surface of the substrate comprises performing a wet-etch process.

7. A method of manufacturing an electrochemical device, the method comprising:
    laminating a first electrode and a second electrode by a sealing layer, wherein at least one of the first electrode and the second electrode is formed by the following steps:
    etching a surface of a substrate;
    conditioning the surface of the substrate after etching the surface of the substrate;
    immersing the substrate in a second solution to form a polymer-protected electrochemical catalyst layer on the surface of the substrate, wherein the second solution contains polymer-capped noble metal nanoclusters dispersed in the second solution; and
    thermally treating the polymer-protected electrochemical catalyst layer at a temperature in the range of 350° C. to 425° C. to degrade the polymer of the polymer-capped noble metal nanoclusters; and
    injecting an electrolyte into a space between the first electrode and the second electrode.

8. The method of claim 7, wherein conditioning the surface of the substrate comprises immersing the substrate in a first solution containing a surfactant to form a conditioner layer on the surface of the substrate.

9. The method of claim 7, further comprising rinsing the substrate before conditioning the surface of the substrate.

10. The method of claim 7, wherein immersing the substrate in the second solution comprises dipping the substrate into the second solution at a temperature below 50° C.

11. The method of claim 7, wherein the second electrode as an anode includes a transparent conductive glass and a dye-impregnated TiO2 layer formed on the transparent conductive glass when the first electrode is a cathode having an electrochemical catalyst layer.

12. The method of claim 7, wherein the polymer-protected electrochemical catalyst layer comprises a noble metal selected from the group consisting of palladium, platinum, ruthenium, silver, and gold.

13. The method of claim 7, wherein the polymer-protected electrochemical catalyst layer comprises a polymer selected from a the group consisting of poly(N-vinyl-2-pyrrolidone) (PVP), poly(acrylamide) (PAM), poly(vinyl alcohol) (PVAL), poly(acrylic acid) (PAA), and poly(ethyleneimine) (PEI).

14. The method of claim 7, wherein etching the surface of the substrate comprises performing a wet-etch process.

* * * * *